United States Patent
May

(10) Patent No.: US 9,842,800 B2
(45) Date of Patent: Dec. 12, 2017

(54) FORMING INTERCONNECT STRUCTURES UTILIZING SUBTRACTIVE PATERNING TECHNIQUES

(71) Applicant: Intel Corporation, Santa Clara, CA (US)

(72) Inventor: Robert A. May, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/082,844

(22) Filed: Mar. 28, 2016

(65) Prior Publication Data

US 2017/0278780 A1    Sep. 28, 2017

(51) Int. Cl.
  *H01L 23/498*   (2006.01)
  *H01L 21/48*    (2006.01)

(52) U.S. Cl.
  CPC ...... *H01L 23/49838* (2013.01); *H01L 21/486* (2013.01); *H01L 23/49827* (2013.01)

(58) Field of Classification Search
  CPC ............. H01L 21/486; H01L 23/49827; H01L 23/49838; H01L 23/49844
  See application file for complete search history.

(56) References Cited

U.S. PATENT DOCUMENTS

| 2006/0046464 A1* | 3/2006 | Miura ............... H01L 23/49822 438/622 |
| 2006/0057866 A1 | 3/2006 | Mirsky et al. |
| 2007/0080360 A1 | 4/2007 | Mirsky et al. |
| 2007/0296075 A1 | 12/2007 | Kwon et al. |
| 2008/0073795 A1 | 3/2008 | Kohl et al. |
| 2014/0167253 A1 | 6/2014 | Tseng et al. |

FOREIGN PATENT DOCUMENTS

WO    2017/171966 A1    10/2017

OTHER PUBLICATIONS

International Search Report and Written Opinion received for International Application No. PCT/US2017/013022, dated Apr. 28, 2017, 12 pages.

* cited by examiner

*Primary Examiner* — Daniel Shook
(74) *Attorney, Agent, or Firm* — Alpine Technology Law Group LLC

(57) ABSTRACT

Methods of forming conductive interconnect structures are described. Those methods/structures may include providing a package substrate comprising a substrate core, and forming at least one conductive interconnect structure disposed on the substrate core. The conductive interconnect structure may comprise a first side that is directly disposed on a surface of the substrate core, and a second side opposite the first side, wherein the second side comprises a greater length than a length of the first side.

15 Claims, 8 Drawing Sheets

FORMING INTERCONNECT STRUCTURES UTILIZING SUBTRACTIVE PATERNING TECHNIQUES

BACKGROUND OF THE INVENTION

Subtractive etching patterning techniques may be used to form conductive interconnect structures utilized in packaging structures/substrates. The routing density in such packaging substrates/structures can be optimized by reducing the minimum line and space dimensions of the conductive interconnect structures.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
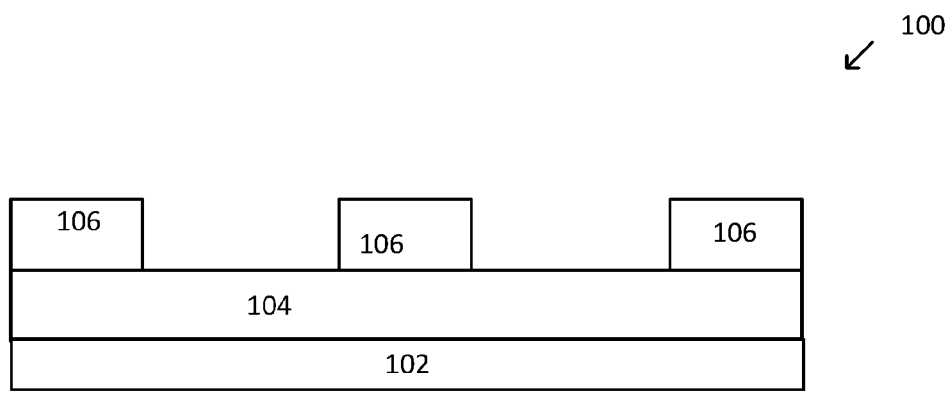
FIG. 1a represents a cross-sectional view of a structure according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

Embodiments of methods of forming packaging structures, such as methods of patterning conductive interconnect structures, are described. Those methods/structures may include providing a package substrate comprising a substrate core, and forming at least one conductive interconnect structure disposed on the substrate core. The conductive interconnect structure may comprise a first side that is directly disposed on a surface of the substrate core, and a second side opposite the first side, wherein the second side comprises a greater length than a length of the first side. The embodiments herein enable reduction of line width and line spacing within packaging structures.

Figure 1B:
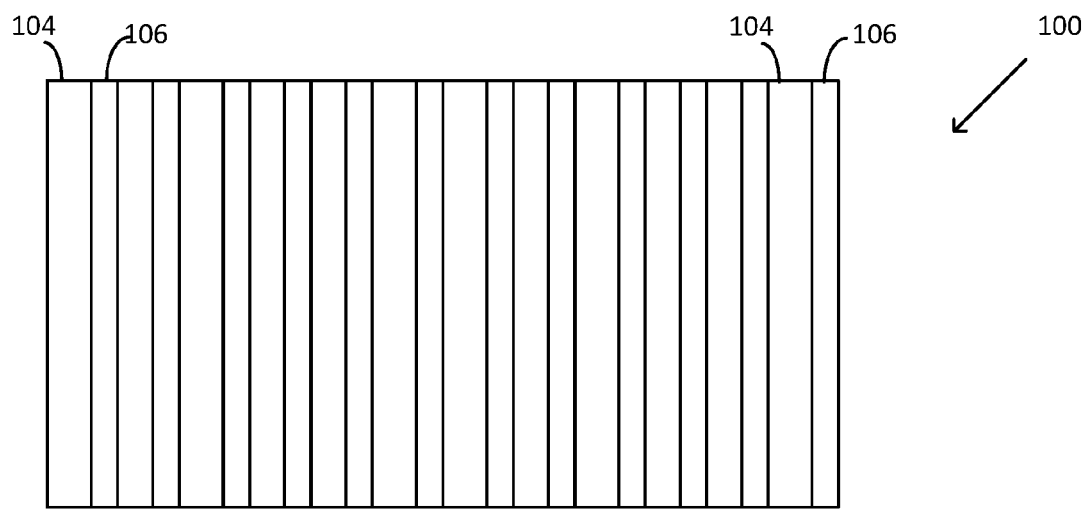
FIG. 1b represents a top view of a structure according to embodiments.

FIGS. 1a-1g illustrate side cross-sectional views of embodiments of fabricating low pitch scaling of interconnect structures in microelectronic devices/packages. In FIG. 1a (x-sectional view) a portion of package structure 100, may comprise a substrate 102, such as a substrate core in one embodiment, and in other embodiments may comprise any other suitable substrate materials, such as but not limited to dielectric materials, for example. In an embodiment, a conductive material 104, such as a copper material 104, may be disposed and/or located on the substrate 102. In an embodiment, the conductive material 104 may comprise a plated copper material. In other embodiments, the conductive material 104 may comprise any suitable conductive material that may be used to fabricate conductive interconnect structures within/on a substrate core and/or a package substrate. Resist material 106, may be formed and patterned on the conductive material 106, in an embodiment. The patterned resist material 106 may comprise any suitable shape and material, and in some cases may comprise a rectangular shape, and may be located adjacent each other on the conductive material 104. In an embodiment, the patterned resist material 106 may comprise a dry film resist (DFR). FIG. 1b depicts a top view of the portion of the package structure 100, wherein the patterned resist 106 is adjacent and alternated with the conductive material 104.

Figure 1C:
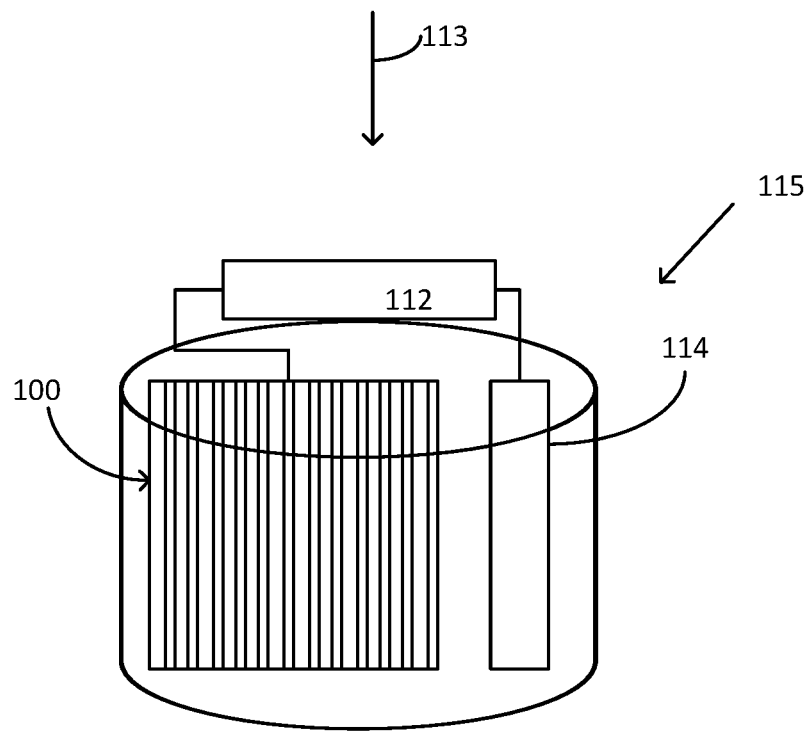
FIG. 1c represents an assembly according to embodiments.

In an embodiment, the portion of the package substrate 100 may be placed/submersed in an anodizing apparatus/bath 115, which may comprise, but is not limited to, a power supply 112, a cathode 114 and an anode, wherein the package structure 100 may function as the anode, in an embodiment (FIG. 1c). In an embodiment, the anodization apparatus 115 may comprise an acid solution. During an anodization process 113, the conductive material 104 may be anodized by applying a current, wherein an oxide is formed on/from the conductive material 104. A balance may be struck between oxide formation and the oxide dissolution in the acid bath, wherein a columnar porous surface may be formed on the conductive oxide. Because of the porosity of the oxide surface, mass transport toward the bottom portion of the oxide is much faster than laterally. Thus, the oxide may propagate more quickly towards the bottom than beneath the resist structure, which encourages anisotropic propagation of the oxide into the conductive material 104. In an embodiment, the anodizing/oxidation of the conductive material 104 may begin at a top portion of the conductive material near where the patterned resist 106 is opened, and may then may widen at a lower portion of the conductive material 104, due to lateral diffusion, resulting in a trapezoid shape after subsequent removal of the conductive oxide.

Figure 1D:
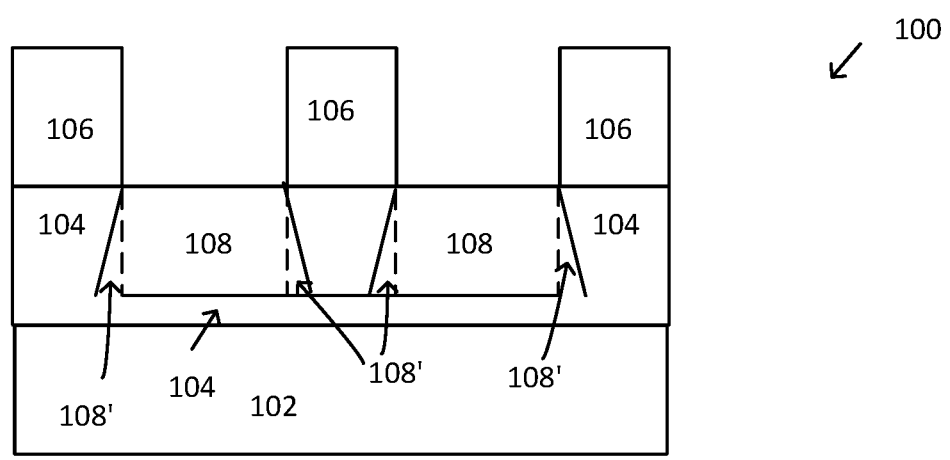
FIGS. 1d-1g represent cross-sectional views of structures according to embodiments.

After/during the anodizing process 113, a conductive oxide 108 may be formed on/in the conductive material 104, and may be formed between and below the patterned resist 106 (FIG. 1d). The oxide 108 may comprise an oxide of the conductive material 104, such as a copper oxide 108, for example. The oxide 108 is formed from the anodizing of the conductive material 104. In an embodiment, a lower portion of the conductive material 104, which is disposed closer to the substrate 102, may form an oxide 108' underneath a portion of the patterned resist 106. In an embodiment, the oxide 108, 108' may eventually short the panel/structure 100 at some point during the anodization process 113, and may leave a layer of conductive material 104 on the bottom portion of the substrate 102.

Figure 1E:
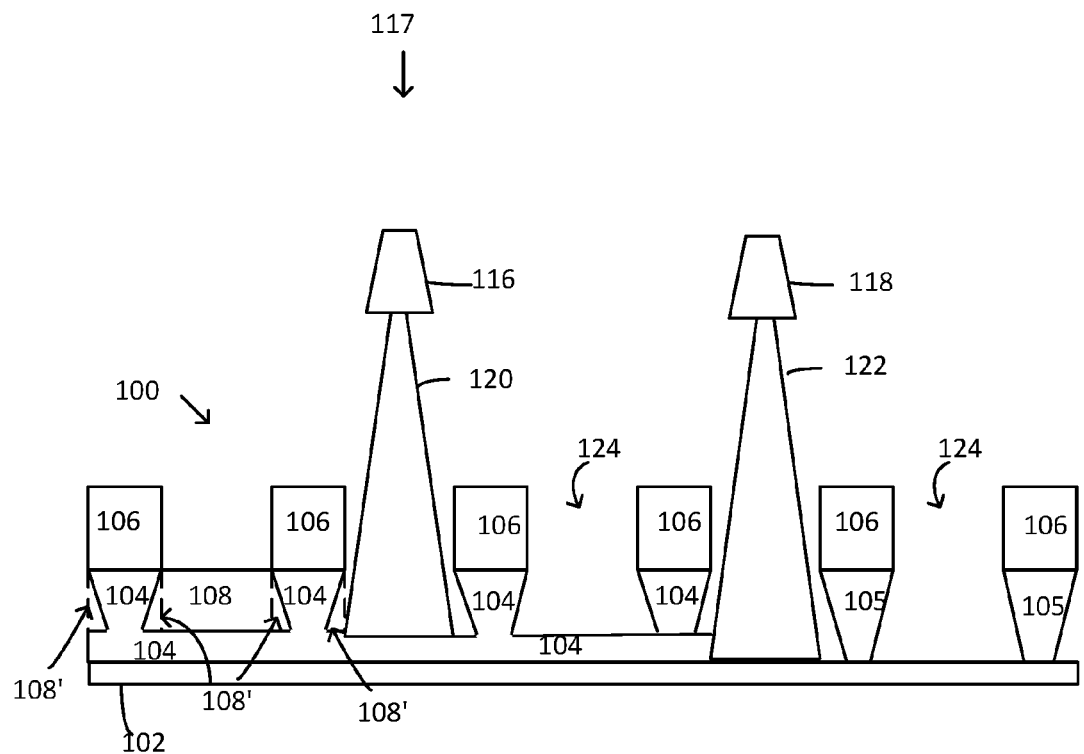

A removal process 117, which may comprise an etching process, may be performed on the oxidized portion of the package structure (FIG. 1e). In an embodiment, a first nozzle 116 may apply a first etchant 120 to the oxidized conductive material 108, 108'. In an embodiment the first etchant 120 may comprise an acid, such as but not limited to acetic acid. In an embodiment, the first etchant 120 may comprise an etchant/material that removes the conductive oxide 108, 108' at a much higher rate than the conductive material 104. In another embodiment, the oxide 108, 108' may be removed by keeping the package structure 100 in the anodization apparatus/bath, without the application of a current. After the removal of the oxide 108, 108', an opening 124 is formed between the patterned resist 106. In an embodiment, due to the lateral formation of the oxide 108, 108' under the resist, the conductive material 104 under the resist may comprise an undercut shape/may be undercut under the resist 104. In an embodiment, a portion of the conductive material 104 may remain on the substrate 102.

Figure 1F:
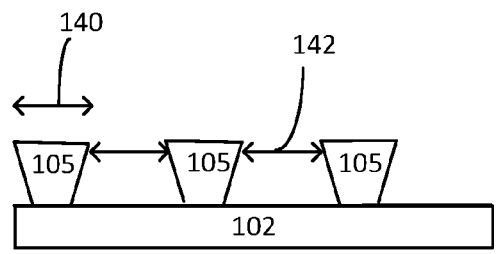

After the removal of the oxide 108, 108', a second etchant 122 may be applied to the package structure 100 by utilizing a second nozzle 118, wherein a remaining conductive material 104 on the substrate 102 may be removed from the substrate 102. A second etchant 122 may be used, such as a metal etchant, to remove any remaining conductive material 104 that may remain on the substrate 102. In an embodiment, the second etchant 122 may comprise a chloride containing etchant, such as and not limited to a copper chloride, for example. In an embodiment, the remaining conductive material 104 may comprise about 2 microns or less in thickness. The resist structures 106 may be removed from the conductive material 104, and a resulting conductive interconnect structure 105 may comprises a trapezoid shape, in an embodiment (FIG. 1f).

Figure 1G:
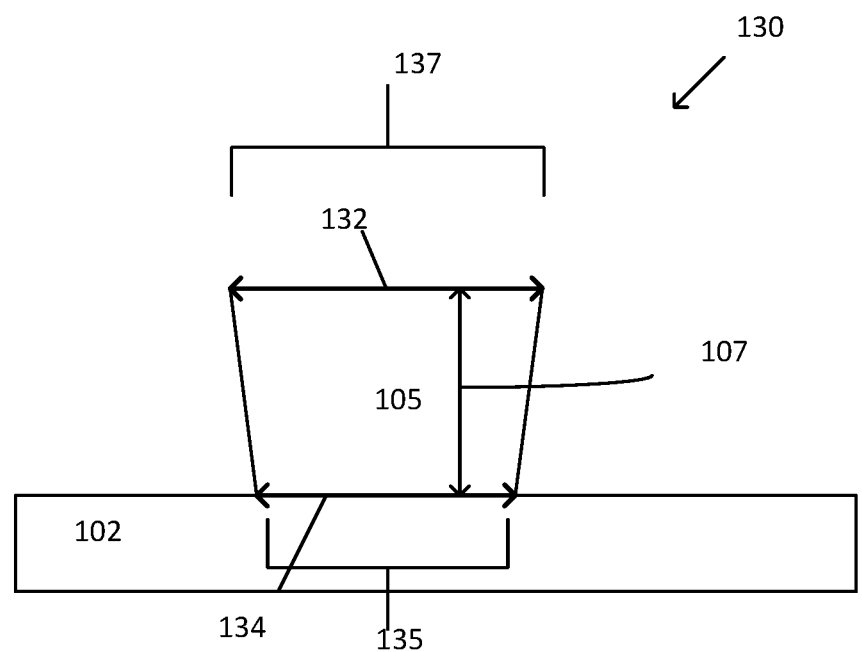

In an embodiment, a spacing 142 between adjacent conductive interconnect structures 105 may comprises about 70 microns or less, and a line width 140 may comprise about 70 microns or less. In an embodiment, a thickness 107 of the conductive interconnect structure 105 may comprise between about 15 to about 70 microns (FIG. 1g). In an embodiment the thickness 107 may comprise greater than about 35 microns. The conductive interconnect structure 105 may comprise a length 135 of a first side/short side 134 that is shorter than a length 137 of the second side/long side 132. In an embodiment, a length 135 of the short side 134 may vary, and in some embodiments, the length 135 of the short side 134 may be substantially equal to the length 137 of the longer side 132, however, the length 135 of the shorter side 134 may not be greater than the length 137 of the long side 132. In an embodiment, the short side 134 is disposed directly on the substrate 102, and the second side is not directly on the substrate 102.

Figure 2A:
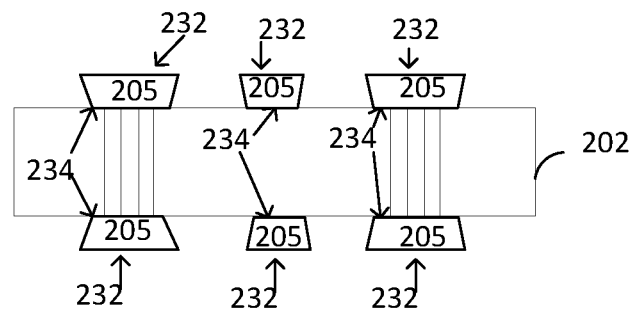
FIGS. 2a-2b represent cross-sectional views of structures according to embodiments.

In another embodiment, conductive interconnects 205 may be disposed/formed on a substrate core 202 portion of a substrate 200 (FIG. 2a). A short side 234 of the conductive interconnect 205 may be disposed on a surface 203, 203' of the substrate core 202, and a long side 232 of the conductive interconnect 205 may be disposed on a side opposite the short side 234. In an embodiment, the long side 232 of the conductive interconnect 205 may not be in direct contact with the surface 203, 203' of the substrate core 202.

Figure 2B:
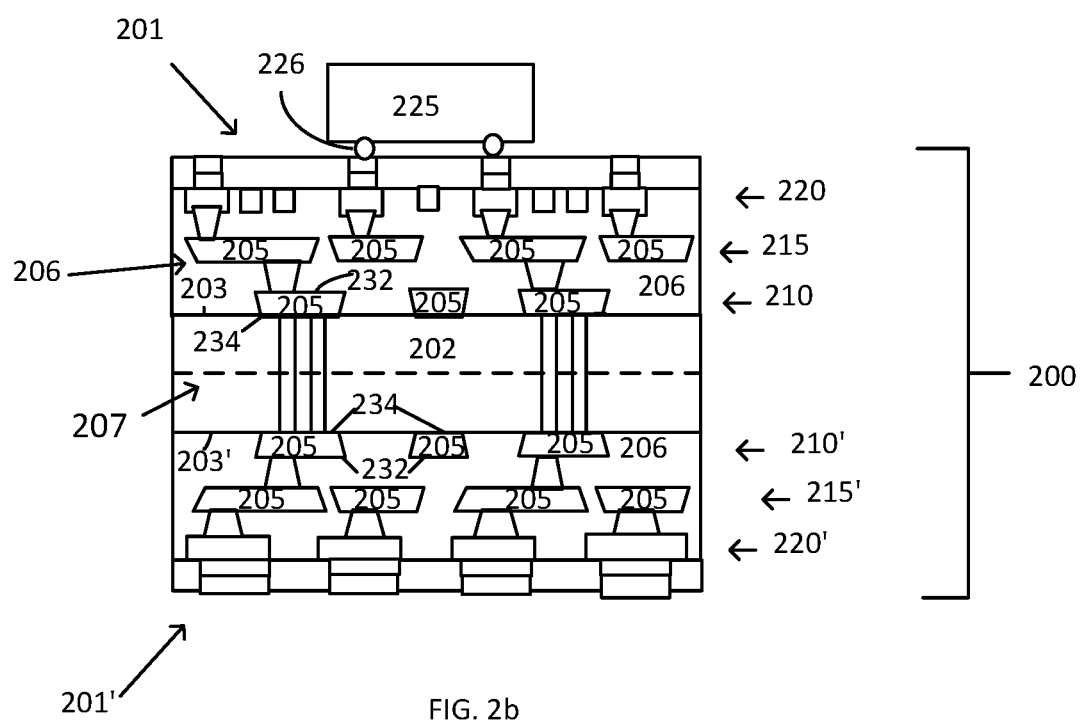

In another embodiment, the substrate 200 may further comprise multiple layers of metallization, such as a first layer 210, 210', a second layer 215, 215' and a third layer 220, 220', for example (FIG. 2b). In other embodiments, the substrate 200 may comprise greater or fewer layers of metallization, according to the particular application. In an embodiment, the first and second layers 210, 210', 215, 215' may comprise at least one conductive interconnect structure 205, wherein the short sides 234 of the at least one conductive structure 205 of the first layers 210, 210' are disposed directly on the surface 203, 203' of the substrate core 202, and the second sides/long sides 232 of the first layer are not directly on the surface 203, 203'. In an embodiment, the short sides 234 of the at least one conductive interconnect 205 of the second level of metallization 215, 215' may be oriented in the same direction as the short sides 232 of the conductive interconnect structures 205 of the first metallization layer 210, 210'. In an embodiment, the first sides 234 of the metallization layers comprising the conductive interconnect structure 205 may be oriented such that they are closer to a midpoint 207 of the package substrate 200, and the second sides 232 may be located a distance farther from the midpoint 207.

In an embodiment, a die 225 may be attached/placed on a surface, 201, 201' of the substrate 200, and in some cases, a die may be embedded (not shown) in the substrate 200. The die 225 may comprise any type of device, such as an integrated circuit device. In one embodiment, the die 225 includes a processing system (either single core or multi-core). For example, the die may comprise a microprocessor, a graphics processor, a signal processor, a network processor, a chipset, etc. In one embodiment, the die 225 comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of die/devices.

A number of interconnects 226 (shown as two, but may include more and of varied arrangement) may extend from the die 225 to the underlying substrate 200, and these interconnects 226 may electrically couple the die 225 and substrate 200. The Interconnects 226 may comprise any type of structure and materials capable of providing electrical communication between the die 225 and the substrate 200, and according to an embodiment, and may include a flip-chip arrangement, for example. In the embodiment, the interconnects 226 may comprises an electrically conductive terminals (not shown) on the die (e.g., a pad, bump, stud bump, column, pillar, or other suitable structure or combination of structures) and may comprise/be coupled with, a corresponding electrically conductive terminal on the substrate 200 (e.g., a pad, bump, stud bump, column, pillar, or other suitable structure or combination of structures). Solder (e.g., in the form of balls or bumps) may be disposed on the terminals of the substrate 200 and/or die 225, and these terminals may then be joined using a solder reflow process. Of course, it should be understood that many other types of interconnects 226 and materials are possible (e.g., wire-bonds extending between the die 225 and substrate 200).

The terminals on the die 225 may comprise any suitable material or any suitable combination of materials, whether disposed in multiple layers or combined to form one or more alloys and/or one or more intermetallic compounds. For example, the terminals on the die 225 may include copper, aluminum, gold, silver, nickel, titanium, tungsten, as well as any combination of these and/or other metals. In other embodiments, a terminal may comprise one or more non-metallic materials (e.g., a conductive polymer). The terminals on substrate 200 may also comprise any suitable material or any suitable combination of materials, whether disposed in multiple layers or combined to form one or more alloys and/or one or more intermetallic compounds. For example, the terminals on the substrate 200 may include copper, aluminum, gold, silver, nickel, titanium, tungsten, as well as any combination of these and/or other metals.

Any suitable solder material may be used to join the mating terminals of the die 225 and substrate 200, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter a solder reflow temperature, for example). In a further embodiment, a layer of underfill material (not shown) may be disposed around interconnects 226 and between the die 225 and substrate 200, and this underfill layer may aid in mechanically securing the die 225 to the substrate 200, and may comprise any suitable material, such as a liquid or a pre-applied epoxy compound.

In another embodiment (not shown), a dielectric material 206 and the metal layers 210, 210' 215, 215', 220, 220' for example, may be built up directly over the die 225 (embedded), in which case a dielectric and subsequent metal layer may be formed directly on the front-side of the die, with a metal layer forming electrical contact with one or more bond pads on the die. In such an embodiment, discrete interconnects 226 may not be necessary, as metallization (such one or more of the metal layers 210, 215, 220) in the substrate 200 may directly contact a die 225 bond pad. Examples of processes that may utilize the aforementioned technique include bumpless build-up layer (BBUL), die-embedding, and wafer-level packaging.

The embodiments herein enable improved device performance by providing packaging interconnect structures that comprise a reduced line space with a thickness of about 35 microns and above. Anisotropic etching is enabled by using an anodizing process to form the conductive interconnect/metal lines, which comprise a decreased footprint, and in some cases are formed without the use of adjacent barrier layers.

Figure 3:
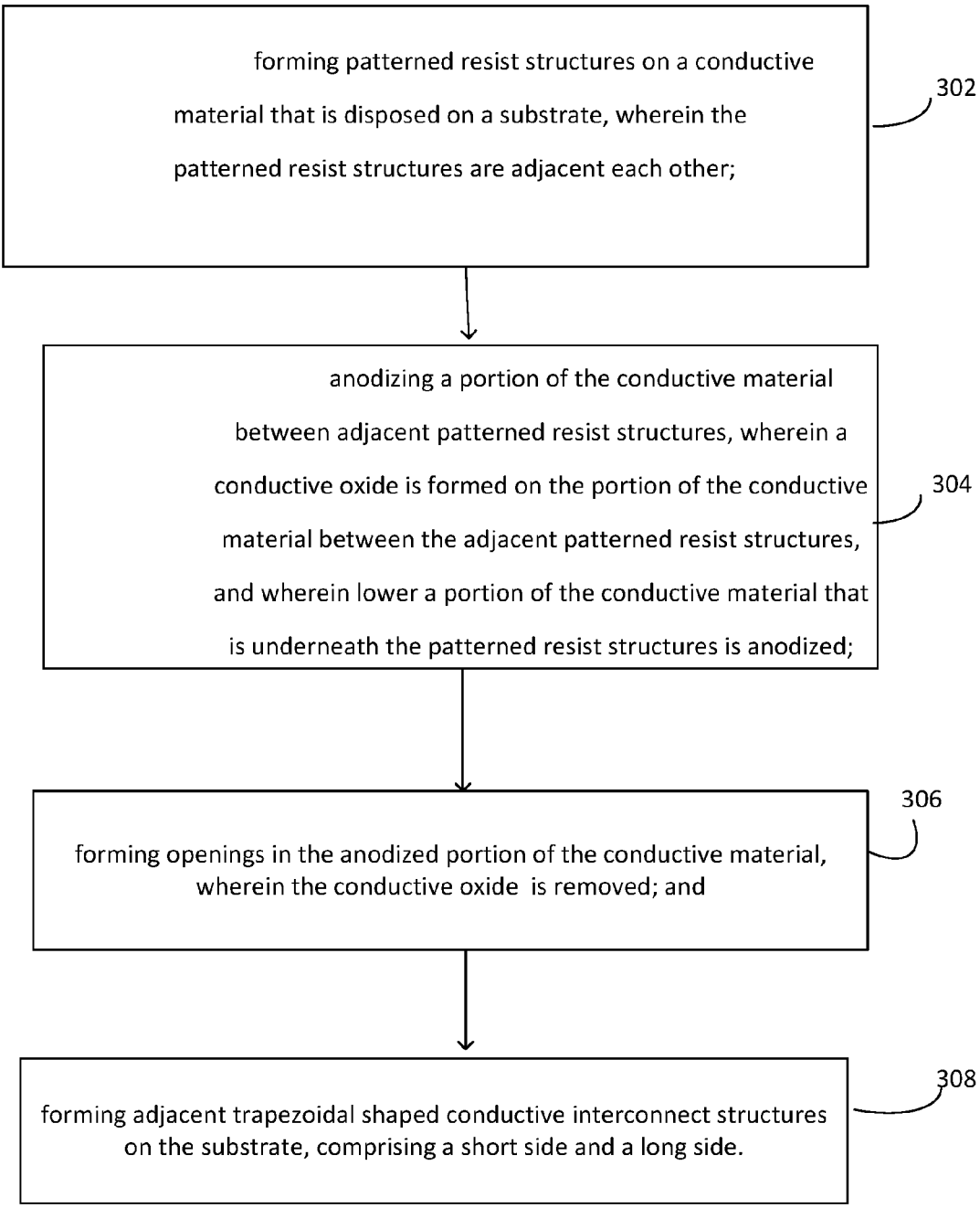
FIG. 3 represents a flow chart of a method according to embodiments.

FIG. 3 depicts a method according to embodiments herein. At step 302, patterned resist structures may be formed on a conductive material that is disposed on a substrate, wherein the patterned resist structures are adjacent each other. At step 304, a portion of the conductive material may be anodized between adjacent patterned resist structures, wherein a conductive oxide is formed on the portion of the conductive material between the adjacent patterned resist structures, and wherein a lower portion of the conductive material that is underneath the patterned resist structures is anodized. At step 306, openings may be formed in the anodized portion of the conductive material, wherein the conductive oxide is removed. In an embodiment, the removal may be performed by a first etchant to remove the conductive oxide, followed by a second etch to remove any remaining conductive material on the substrate. In another embodiment, the oxide material may first be removed by maintaining the material in the anodization bath without the application of a current. At step 308, trapezoidal conductive interconnect structures may be formed, which may comprise a short side and a long side. In an embodiment, the short side is formed directly in contact with the substrate.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the device structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 4:
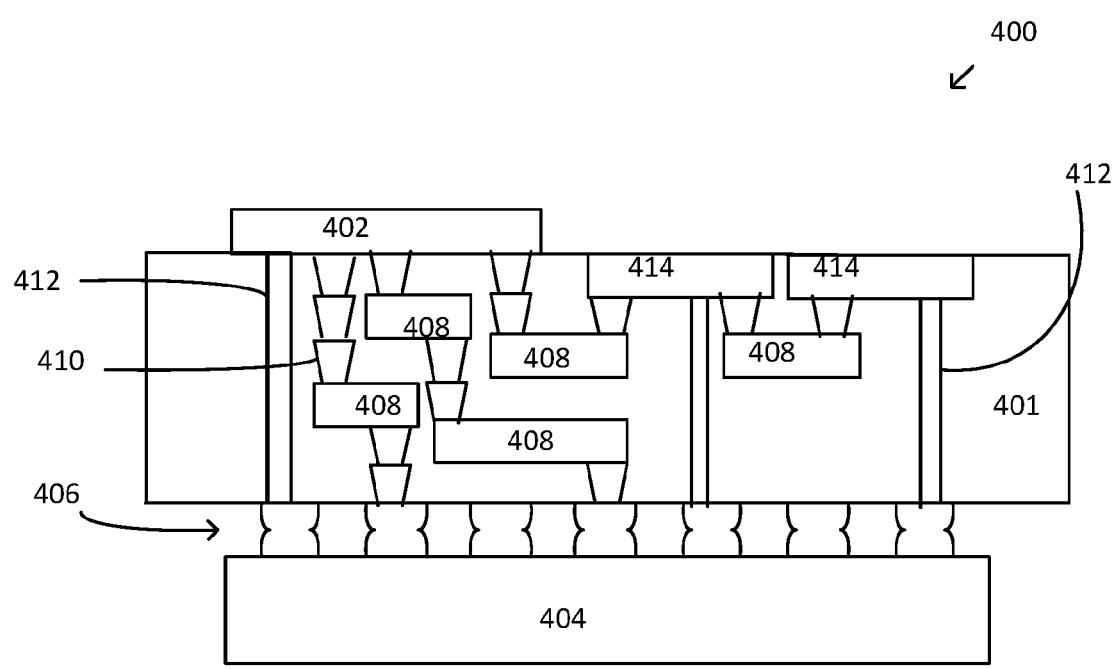
FIG. 4 represents an interposer implementing one or more embodiments.

FIG. 4 illustrates a device 400 that includes one or more of the package structure embodiments included herein. The device 400 may include interposer 401, which may comprise an intervening substrate used to bridge a first substrate 402 to a second substrate 404. The first substrate 402 may include embodiments of the structures described herein, and may further comprise a memory device, in an embodiment. The second substrate 404 may be, for instance, a memory module, a computer motherboard, a processor device, or any other integrated circuit die, for example. Generally, the purpose of an interposer 401 is to spread a connection to a wider pitch or to reroute a connection to a different connection.

For example, an interposer 401 may couple an integrated circuit die to a ball grid array (BGA) 406 that can subsequently be coupled to the second substrate 404. In some embodiments, the first and second substrates 402/404 are attached to opposing sides of the interposer 401. In other embodiments, the first and second substrates 402/404 are attached to the same side of the interposer 401. And in further embodiments, three or more substrates are interconnected by way of the interposer 401.

The interposer 401 may be formed of an epoxy resin, a fiberglass-reinforced epoxy resin, a ceramic material, or a polymer material such as polyimide. In further implementations, the interposer may be formed of alternate rigid or flexible. The interposer may include metal interconnects 408 and vias 410, and may also include through-silicon vias (TSVs) 412. The interposer 401 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 401. In accordance with embodiments, apparatuses or processes disclosed herein may be used in the fabrication of interposer 401.

Figure 5:
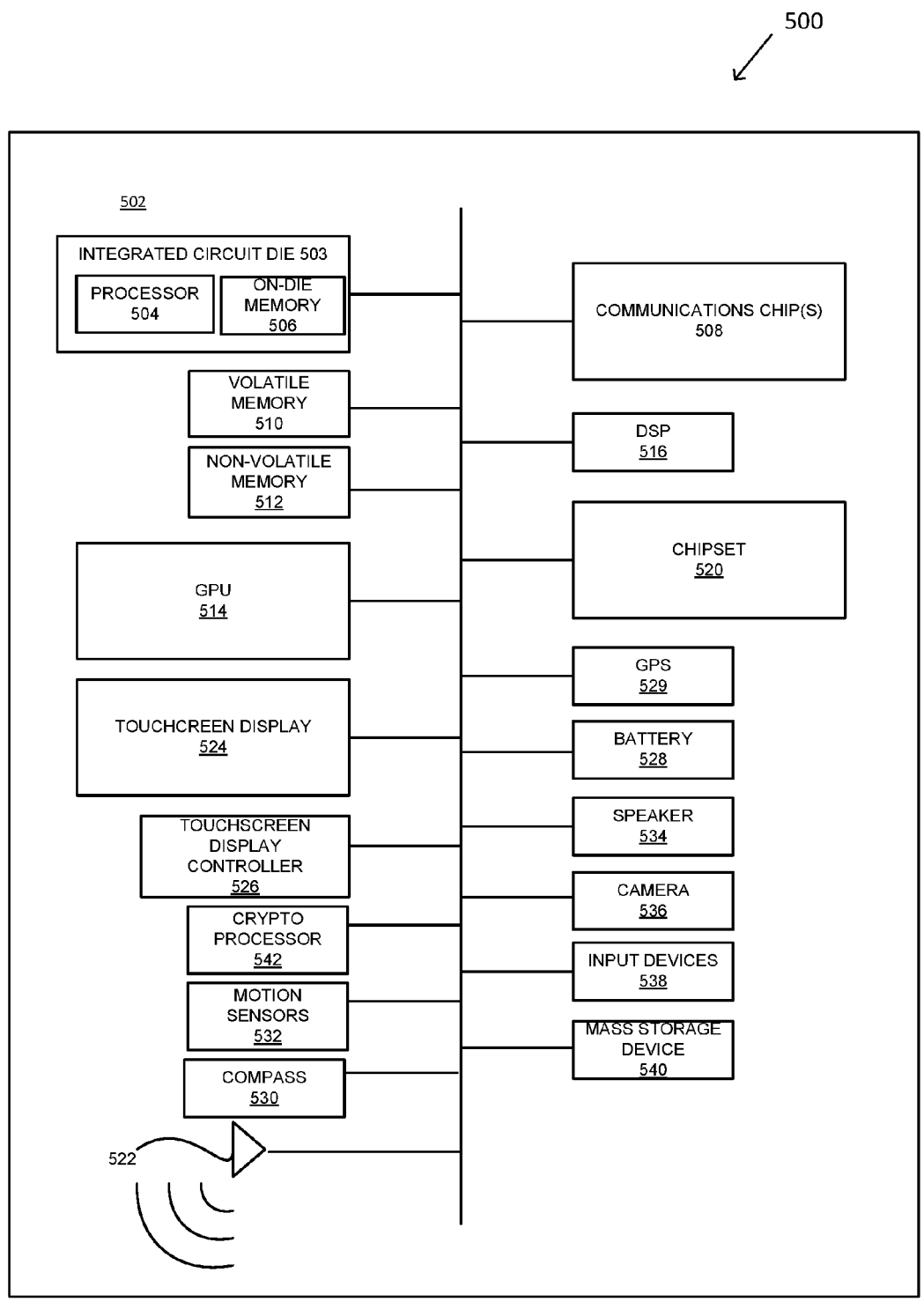
FIG. 5 represents a schematic of a system according to embodiments.

FIG. 5 is a schematic of a computing device 500 that may be implemented incorporating embodiments of the package structures described herein. In an embodiment, the computing device 500 houses a board 502, such as a motherboard 502 for example. The board 502 may include a number of components, including but not limited to a processor 504, and an on-die memory 506, that may be communicatively coupled with an integrated circuit die 503, and at least one communication chip 508. The processor 504 may be physically and electrically coupled to the board 502. In some implementations the at least one communication chip 508 may be physically and electrically coupled to the board 502. In further implementations, the communication chip 506 is part of the processor 504.

Depending on its applications, computing device 500 may include other components that may or may not be physically and electrically coupled to the board 502, and may or may not be communicatively coupled to each other. These other components include, but are not limited to, volatile memory (e.g., DRAM) 510, non-volatile memory (e.g., ROM) 512, flash memory (not shown), a graphics processor unit (GPU) 514, a digital signal processor (DSP) 516, a crypto processor 542, a chipset 520, an antenna 522, a display 524 such as a touchscreen display, a touchscreen controller 526, a battery 528, an audio codec (not shown), a video codec (not shown), a global positioning system (GPS) device 529, a compass 530, accelerometer, a gyroscope and other inertial sensors 532, a speaker 534, a camera 536, various input devices 538 and a mass storage device (such as hard disk drive, or solid state drive) 540, compact disk (CD) (not shown), digital versatile disk (DVD) (not shown), and so forth). These components may be connected to the system board 502, mounted to the system board, or combined with any of the other components.

The communication chip 508 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic structure comprising a package substrate, a substrate core within the package substrate, at least one conductive interconnect structure disposed on the substrate core, wherein a first side of the at least one conductive interconnect structure is directly disposed on a surface of the substrate core, and a second side of the conductive interconnect structure, wherein the second side is opposite the first side, and wherein the second side comprises a greater length than a length of the first side.

Example 2 includes the structure of example 1 wherein the at least one conductive interconnect structure comprises copper.

Example 3 includes the structure of example 1 wherein the at least one conductive interconnect structure comprises a trapezoidal structure.

Example 4 includes the structure of example 1 wherein the at least one conductive interconnect structure comprises a thickness of between about 15 to about 70 microns.

Example 5 includes the structure of example 1 wherein the at least one conductive interconnect structure comprises a first conductive interconnect structure and a second conductive interconnect structure, wherein the first and second conductive interconnect structures are adjacent to one another, and wherein a spacing between the first and second conductive interconnect structures is less than about 70 microns.

Example 6 includes the structure of example 1 wherein the interconnect structure is more than about 35 microns in thickness.

Example 7 includes the structure of example 1 wherein a die is electrically and mechanically coupled to the package substrate.

Example 8 includes the structure of example 1 wherein a width of the conductive interconnect structure is about 70 microns or less.

Example 9 is a device structure comprising a package substrate comprising a first metallization layer and a dielectric layer on the first metallization layer, wherein the first metallization layer comprises at least one conductive interconnect structure; and
a first side of the at least one conductive interconnect structure and a second side of the at least one conductive structure, wherein a length of the second side is greater than a length of the first side, and wherein the first side is disposed closer to a midpoint of the substrate, and wherein the second side is disposed a distance farther away from the midpoint than the first side.

Example 10 includes the device structure of example 9 wherein the at least one conductive interconnect structure comprises copper.

Example 11 includes the device structure of example 9 wherein the package substrate comprises a second metallization layer, wherein the second metallization layer comprises at least one conductive interconnect structure, and wherein the first sides of the at least one conductive interconnect structures of the second metallization layer are oriented in the same direction as the first sides of the first metallization layer.

Example 12 includes the device structure of example 9 wherein the first sides of the at least one conductive interconnect structure are directly disposed on a substrate core, and wherein the second sides are not directly disposed on the substrate core.

Example 13 includes the device structure of example 9 wherein adjacent conductive interconnect structures comprises a line width of less than about 70 microns.

Example 14 includes the device structure of example 9 wherein a thickness of the conductive interconnect structures comprises about greater than about 35 microns.

Example 15 includes the device structure of example 9 wherein the at least one conductive interconnect structure comprises a line spacing of about 70 microns or less.

Example 16 includes the device structure of example 9, wherein the package substrate further comprises a die mechanically and electrically coupled thereto.

Example 17 is a method of forming a microelectronic structure, comprising: forming a conductive material on a portion of a package substrate, wherein the conductive material comprises at least one patterned resist structure on a surface of the conductive material; anodizing the conductive material between the adjacent ones of the patterned resist material to form a conductive oxide between the adjacent ones of the at least one patterned resist structure; forming an opening between the adjacent ones of the patterned resist structures, wherein a plurality of adjacent conductive interconnect structures are formed, wherein each of the plurality of adjacent conductive interconnect structures comprises a first side and a second side opposite the first side, and wherein the first side is shorter than a second side, and wherein the first side is directly on the portion of the package substrate.

Example 18 includes the method of example 17 wherein forming the conductive oxide further comprises anodizing a lower portion of the conductive material underneath the resist.

Example 19 includes the method of example 17 wherein forming the opening comprises removing the conductive oxide, and then removing a remaining portion of the conductive material from the package substrate.

Example 20 includes the method of example 17 wherein the conductive interconnect comprises a trapezoid shape.

Example 21 includes the method of example 17 further comprising wherein the conductive oxide is removed by using a first etchant, and the remaining conductive material is removed by using a second etchant.

Example 22 includes the method of example 17 further comprising wherein the conductive interconnect structure comprises a thickness of at least about 35 microns.

Example 23 includes the method of example 17 further comprising wherein a line width and a line spacing of the conductive interconnect structure is less than about 70 microns.

Example 24 includes the method of example 17 further comprising wherein at least one die is coupled to the package structure.

Example 25 includes the method of example 17 wherein the conductive oxide is removed with an anisotropic etch.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic structure comprising:
   a package substrate;
   a substrate core within the package substrate;
   at least one conductive interconnect structure disposed on the substrate core, wherein the at least one conductive structure comprises a trapezoid structure, wherein a first side of the at least one conductive interconnect structure is directly disposed on a dielectric portion of the substrate core; and
   a second side of the conductive interconnect structure, wherein the second side is opposite the first side, and wherein the second side comprises a greater length than a length of the first side.

2. The structure of claim 1 wherein the at least one conductive interconnect structure comprises copper.

3. The structure of claim 1 wherein the at least one conductive interconnect structure comprises a thickness of between about 15 to about 70 microns.

4. The structure of claim 1 wherein the at least one conductive interconnect structure comprises a first conductive interconnect structure and a second conductive interconnect structure, wherein the first and second conductive interconnect structures are adjacent to one another, and wherein a spacing between the first and second conductive interconnect structures is less than about 70 microns.

5. The structure of claim 1 wherein the at least one interconnect structure is more than about 30 microns in thickness.

6. The structure of claim 1 wherein a die is electrically and mechanically coupled to the package substrate.

7. The structure of claim 1 wherein a width of the at least one conductive interconnect structure is about 70 microns or less.

8. A device structure comprising:
a package substrate comprising a first metallization layer and a dielectric layer on the first metallization layer, wherein the first metallization layer comprises a plurality of conductive interconnect structures;
a first side of an individual one of the plurality of conductive interconnect structures, wherein the first side is disposed directly on a dielectric portion of the substrate core of the package substrate;
a second side of the individual one of the plurality of conductive structures wherein the second side of the individual one is disposed directly on the dielectric layer, wherein a length of the second side is greater than a length of the first side, wherein the individual one of the plurality of conductive structures comprises a trapezoid structure, and wherein the first side comprises a side of the trapezoid structure.

9. The device structure of claim 8 wherein the plurality of conductive interconnect structures comprises copper.

10. The device structure of claim 8 wherein individual ones of the plurality of conductive interconnect structures comprise a trapezoidal structure.

11. The device structure of claim 8 wherein the second sides of individual ones of the plurality of conductive interconnect structures are not directly disposed on the substrate core.

12. The device structure of claim 8 wherein at least one of the plurality of conductive interconnect structures comprise a line width of less than about 70 microns.

13. The device structure of claim 8 wherein a thickness of the individual ones of the plurality of conductive interconnect structures comprises greater than about 35 microns.

14. The device structure of claim 13 wherein adjacent ones of the plurality of conductive interconnect structures comprise a line spacing of about 70 microns or less.

15. The device structure of claim 8, wherein the package substrate further comprises a die mechanically and electrically coupled thereto.

* * * * *